United States Patent [19]

Sato et al.

[11] Patent Number: 5,639,587
[45] Date of Patent: Jun. 17, 1997

[54] POSITIVE PHOTORESIST COMPOSITION CONTAINING ALKALI SOLUBLE RESINS AND QUINONEDIAZIDE ESTER MIXTURE

[75] Inventors: Kenichiro Sato; Koji Shirakawa; Shinji Sakaguchi, all of Shizuoka, Japan

[73] Assignee: Fuji Photo Film Co., Ltd., Kanagawa, Japan

[21] Appl. No.: 615,832

[22] Filed: Mar. 14, 1996

[30] Foreign Application Priority Data

Mar. 17, 1995 [JP] Japan .................................. 7-059371

[51] Int. Cl.$^6$ ...................................................... G03F 7/023
[52] U.S. Cl. ........................... 430/190; 430/191; 430/192; 430/193
[58] Field of Search ................................ 430/190, 191, 430/192, 193

[56] References Cited

U.S. PATENT DOCUMENTS 5,407,778  4/1995  Uetani et al. .......................... 430/193
5,529,881  6/1996  Kawabe et al. ........................ 430/193

*Primary Examiner*—Christopher G. Young
*Attorney, Agent, or Firm*—Sughrue, Mion, Zinn, Macpeak & Seas

[57] ABSTRACT

A positive photoresist composition is disclosed, which comprises an alkali-soluble resin, at least one of 1,2-naphthoquinonediazidesulfonic monoesters of specific polyhydroxy compounds, and at least one of 1,2-naphthoquinonediazidesulfonic ester of specific polyhydroxy compounds. The positive photoresist composition exhibits remarkably improved sensitivity and resolution, and broad development latitude regardless of the film thickness, and further, low film thickness dependence of resist performances.

3 Claims, No Drawings

POSITIVE PHOTORESIST COMPOSITION CONTAINING ALKALI SOLUBLE RESINS AND QUINONEDIAZIDE ESTER MIXTURE

FIELD OF THE INVENTION

The present invention relates to a positive photoresist composition which comprises an alkali-soluble resin and specific 1,2-quinonediazide compounds and is sensitive to radiant rays such as ultraviolet rays, far ultraviolet rays, X rays, electron beams, molecular beams, γ rays, and synchrotron radiations. Particularly, the present invention relates to a positive photoresist for fine processing which has high resolution regardless of fluctuation in the film thickness, high sensitivity, and also a satisfactory latitude of development.

BACKGROUND OF THE INVENTION

A positive photoresist is applied on a substrate such as a semiconductor wafer, glass, a ceramic, or a metal by spin coating or roller coating at a thickness of from 0.5 to 2 μm. The coating is dried by heating, and then irradiated with, e.g., ultraviolet ray through an exposure mask to cure the coating in the form of, e.g., a circuit pattern. If desired, the exposed coating is baked. Thereafter, the coating is developed to form a positive image.

By etching the substrate using this positive image as a mask, the surface of the substrate can be pattern-wise processed. Typical applications of the positive photoresist include manufacture of semiconductors such as IC and the like, manufacture of circuit boards for liquid crystals and thermal heads, and other photofabrication processes.

However, the degree of integration in integrated circuits is becoming higher increasingly, and the production of substrates for semiconductor circuits, e.g., VLSI's (very large scale integrated circuit), has come to necessitate a processing for forming an ultrafine pattern having a line width of 0.5 μm or smaller. The photoresists for use in this application are required to attain high resolving power especially stably and have a wide development latitude so as to ensure a constant pattern line width always. The photoresists are also required not to leave a residue on the developed resist pattern so as to prevent the circuit from having processing defects.

On the other hand, it has been found that in the formation of an ultrafine pattern, in particular, one having a line width of 0.5 μm or smaller, there is a phenomenon in which even though a certain degree of resolving power is obtained at a certain coating film thickness, this resolving power deteriorates upon a slight change in coating film thickness (hereinafter, this phenomenon is referred to as "film thickness dependence"). It has surprisingly been also found that when the film thickness changes by only a few hundredths of a micrometer, the resolving power changes considerably, and that all the representative positive working photoresists currently on the market more or less show this tendency. Specifically, when the thickness of an unexposed resist film varies from the intended film thickness in the range of $\lambda/4n$ ($\lambda$ is exposure wavelength and n is the refractive index of the resist film at that wavelength), the resulting resolving power fluctuates accordingly.

The presence of this problem of film thickness dependence was pointed out in, e.g., *SPIE Proceedings*, Vol. 1925, p. 626 (1993), where there is a description to the effect that the film thickness dependence is caused by multiple light reflection in the resist film.

This film thickness dependence has been found to be enhanced in most cases particularly when resist contrast is heightened so as to obtain a high resolving power and a pattern having a rectangular section. In the actual processing of a semiconductor substrate, a pattern is formed from a resist film whose thickness slightly varies from part to part due to the surface roughness of the substrate and unevenness of coating thickness. Therefore, this film thickness dependence has been an obstacle to the pattern formation in which a positive working photoresist is used to conduct fine processing at a resolution close to its resolution limit.

Accordingly, the photoresists are required to exhibit high performances with respect to the above-mentioned various properties.

To improve the resolution, use of polyhydroxy compounds having various particular structures has been proposed so far. For example, a number of 1,2-naphthoquinonediazide compounds are proposed. These compounds are disclosed in, e.g., JP-A-57-63526, JP-A-60-163043, JP-A-62-10645, JP-A-62-10646, JP-A-62-150245, JP-A-63-220139, JP-A-64-76047, JP-A-1-189644, JP-A-2-285351, JP-A-2-296248, JP-A-2-296249, JP-A-3-48249, JP-A-3-48250, JP-A-3-158856, JP-A-3-228057, JP-A-4-502519 (Tokkohyo), U.S. Pat. Nos. 4,957,846, 4,992,356, 5,151,340, and 5,178,986, and European Patent 530 148. (The terms "JP-A" as used herein means an "unexamined published Japanese patent application".) However, these photosensitive material are insufficient from the standpoint of reducing the film thickness dependence.

Also, these compounds only brings about insufficient improvement in the above-mentioned various performances. Particularly, there is still a room to improve the sensitivity, resolution and the above-mentioned dependence on film thickness.

SUMMARY OF THE INVENTION

An object of the present invention is to provide a positive photoresist composition which ensures high sensitivity regardless of fluctuation in the film thickness, high resolution, and a broad development latitude, and further has the resist performances with low film thickness dependence. Particularly, the present invention is aimed at to provide a positive photoresist composition which is markedly improved in sensitivity and resolution.

The term "film thickness dependence" as used herein means the fluctuation of the resolving power of a resist obtained through exposure, baking if desired, and development when the thickness of an unexposed resist film varies in the range of $\lambda/4n$.

As a result of intensive studies with attention to the above-mentioned characteristics, the present inventors found that those problems can be solved by using at least one quinonediazide compound monoester of a polyhydroxy compound containing 2 aromatic rings having specific nuclear structures in combination with at least one quinonediazides compound ester of a polyhydroxy compounds containing 3 to 5 aromatic rings having specific nuclear structures, thus completing the present invention based on this finding.

That is, the above-mentioned object of the present invention can be achieved by a photoresist of the following construction:

A positive photoresist composition comprising an alkali-soluble resin, at least one of 1,2-naphthoquinonediazidesulfonic monoesters of polyhydroxy compounds represented by the following formulae [I] to [IV], and at least one of 1,2-naphthoquinonediazidesulfonic esters of polyhydroxy compounds represented by the following formulae [V] to [VII].

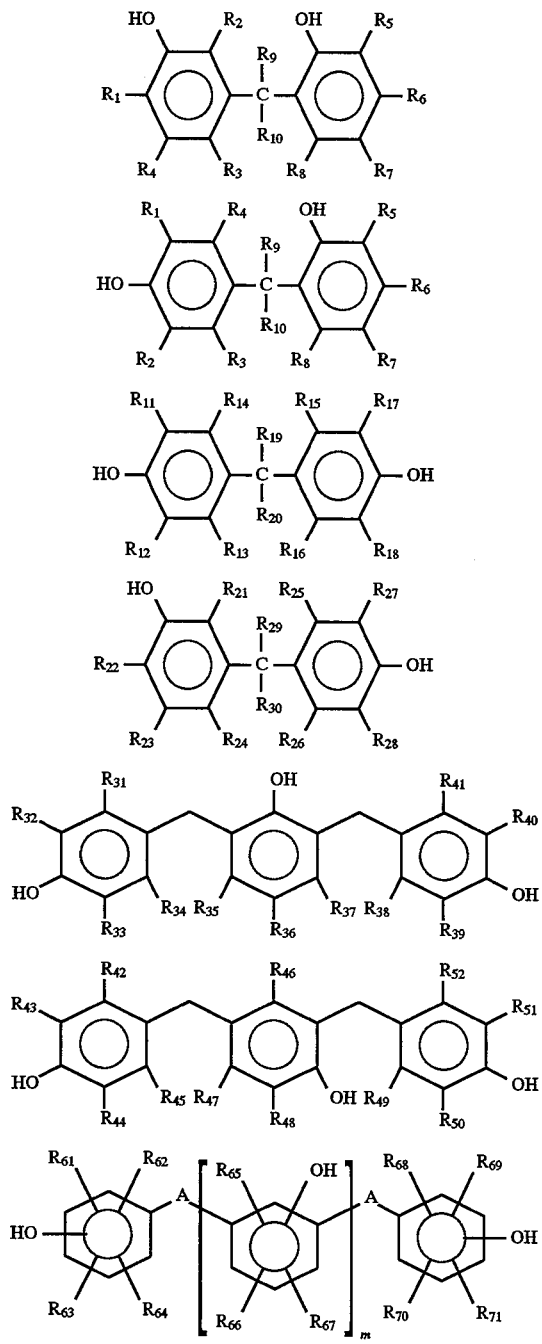

wherein $R_1$ and $R_2$ each independently represent a hydrogen atom, a halogen atom, an alkyl group, or an aryl group, with the proviso that either one of $R_1$ and $R_2$ is a hydrogen atom; $R_3$ and $R_4$ each independently represent a hydrogen atom, a halogen atom, an alkyl group, an aryl group, or a cycloalkyl group; $R_5$ represents a hydrogen atom, an alkyl group, an aryl group, or a cycloalkyl group, with the proviso that $R_5$ can not be a hydrogen atom, when both of $R_9$ and $R_{10}$ are hydrogen atoms; $R_6$ to $R_8$ each independently represent a hydrogen atom, an alkyl group, an aryl group, or a cycloalkyl group; $R_9$ and $R_{10}$ each independently represent a hydrogen atom or an alkyl group, or may combine with each other to form a ring; $R_{11}$, $R_{12}$, $R_{21}$, and $R_{22}$ each independently represent a hydrogen atom, a halogen atom, an alkyl group, or an aryl group, with the proviso that either one of $R_{11}$ and $R_{12}$ and either one of $R_{21}$ and $R_{22}$ are hydrogen atoms; $R_{13}$, $R_{14}$, $R_{23}$, and $R_{24}$ each independently represent a hydrogen atom, a halogen atom, an alkyl group, an aryl group, or a cycloalkyl group; $R_{15}$, $R_{16}$, $R_{25}$, and $R_{26}$ each independently represent a hydrogen atom, an alkyl group, an aryl group, or a cycloalkyl group; $R_{19}$ and $R_{20}$, and $R_{29}$ and $R_{30}$ each independently have the same meaning as that of $R_9$ and $R_{10}$; $R_{17}$, $R_{18}$, $R_{27}$, and $R_{28}$ each independently represent a hydrogen atom, an alkyl group, an aryl group, or a cycloalkyl group, with the proviso that both of $R_{17}$ and $R_{18}$ and both of $R_{27}$ and $R_{28}$ are not hydrogen atoms at the same time; $R_{31}$ to $R_{52}$ each independently represent a hydrogen atom, a halogen atom, an alkyl group, an alkoxyl group, or a cycloalkyl group, with the proviso that at least one of $R_{31}$ to $R_{41}$ and at least one of $R_{42}$ to $R_{52}$ are cycloalkyl groups; $R_{61}$ to $R_{71}$ each independently represent a hydrogen atom, a halogen atom, an alkyl group, an aryl group, an alkoxyl group, an acyl group, or a cycloalkyl group, with the proviso that at least one of $R_{61}$ to $R_{71}$ is a cycloalkyl group; A represents —CH($R_{72}$)—, in which $R_{72}$ represents a hydrogen atom or an alkyl group; and m represents 2 or 3.

The photoresist composition of the present invention attains the all of high sensitivity, high resolution and a broad development latitude, and also satisfactory photoresist performances regarding film thickness dependance by using the quinonediazide compound monoesters of the polyhydroxy compound containing 2 aromatic rings having specific structures in combination with quinonediazide compound ester of the polyhydroxy compounds containing 3 to 5 aromatic rings having specific structures. The present invention ensures markedly excellent sensitivity and resolution regardless of fluctuation in the film thickness.

According to the present invention, a further improvement in the above-mentioned effects of the present invention can be attained by using a combination of a fractionated (or monodispersion) novolak resin with a phenolic hydroxy group-containing low-molecular weight compound wherein the total number of carbon atoms and the number of hydroxyl groups are regulated (alkali dissolution-enhancing agent (SE agent)) in addition to the combined use of the above-mentioned quinonediazide compounds esters. The combined use of the novolak resin with the regulated low-molecular weight compound provides a remarkable improvement in the sensitivity of the photoresist as expected by virtue of dissolution-enhancing action of the law-molecular weight compound, and in addition, it unexpectedly provides a remarkable broad development latitude as compared to a case where either one of the novolak resin and the low-molecular weight compound is used singly.

DETAILED DESCRIPTION OF THE INVENTION

The polyhydroxy compounds represented by formulas [I] to [VII] are described in great detail.

As to $R_1$ to $R_4$, $R_{11}$ to $R_{14}$, and $R_{21}$ to $R_{24}$ of formulas [I] to [IV], preferred examples of the halogen atom include a chlorine atom, a bromine atom and an iodine atom, and among these, a chlorine atom is particularly preferred. Preferred examples of the alkyl group include a methyl group and an ethyl group, and a methyl group is more preferred. Preferred examples of the aryl group include a phenyl group, a tolyl group, a xylyl group, and a cumenyl group. Preferred examples of the cycloalkyl group for $R_3$, $R_4$, $R_{13}$, $R_{14}$, $R_{23}$ and $R_{24}$ include a cyclopentyl group and a cyclohexyl group.

$R_1$, $R_2$, $R_{11}$, $R_{12}$, $R_{21}$, and $R_{22}$ are preferably a hydrogen atom, a chlorine atom, a methyl group, an ethyl group, or a phenyl group, and $R_3$, $R_4$, $R_{13}$, $R_{14}$, $R_{23}$, and $R_{24}$ are preferably a hydrogen atom, a methyl group or an ethyl group.

As to $R_5$ to $R_8$, $R_{15}$ to $R_{18}$ and $R_{25}$ to $R_{28}$ of formulas [I] to [IV], preferred examples of the alkyl group include lower alkyl groups having 1 to 4 carbon atoms. Preferred examples of the aryl group include a phenyl group, a tolyl group, a xylyl group, and cumenyl group. Preferred examples of the cycloalkyl group include a cyclopentyl group and a cyclohexyl group.

$R_5$ is preferably a hydrogen atom, a methyl group, an ethyl group, a propyl group and n-butyl group, with the proviso that $R_5$ is not a hydrogen atom when both of $R_9$ and $R_{10}$ are hydrogen atoms. $R_{17}$, $R_{18}$, $R_{27}$, and $R_{28}$ are preferably a hydrogen atom, a lower alkyl group having 1 to 4 carbon atoms, a cycloalkyl group, and a phenyl group, with the proviso that both of $R_{17}$ and $R_{18}$ and both of $R_{27}$ and $R_{28}$ are not hydrogen atoms at the same time. When either one of $R_{17}$ and $R_{18}$ and either one of $R_{27}$ and $R_{28}$ are hydrogen atoms, the others are preferably an isopropyl group, a sec-butyl group, tert-butyl group or a cyclohexyl group. When neither of $R_{17}$ and $R_{18}$ or neither of $R_{27}$ and $R_{28}$ is a hydrogen atom at the same time, they are preferably a methyl group, an ethyl group, a propyl group and a phenyl group.

$R_6$ to $R_8$, $R_{15}$, $R_{16}$, $R_{25}$, and $R_{26}$ are preferably a hydrogen atom, a methyl group, an ethyl group, a cyclohexyl group or a phenyl group.

Preferred examples of the alkyl group for $R_9$, $R_{10}$, $R_{19}$, $R_{20}$, $R_{29}$, and $R_{30}$ include lower alkyl groups having 1 to 4 carbon atoms. Among them, a methyl group and an ethyl group are preferred and a methyl group is more preferred.

Examples of the polyhydroxy compounds represented by formulae [I] to [IV] which can be used in the present invention are shown below:

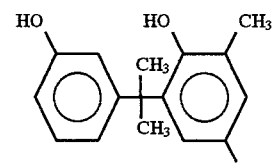
[I-1]

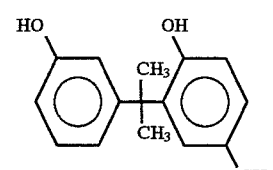
[I-2]

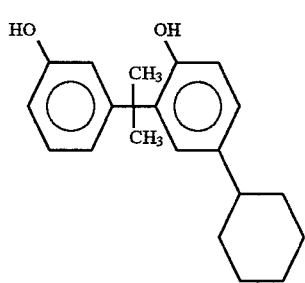
[I-3]

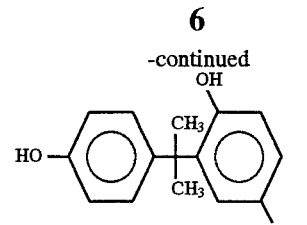
[II-1]

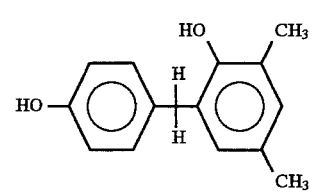
[II-2]

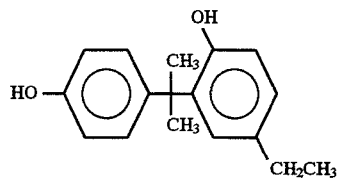
[II-3]

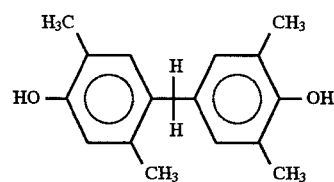
[III-1]

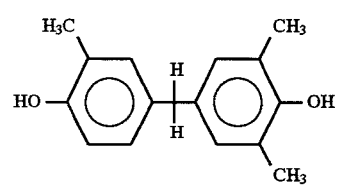
[III-2]

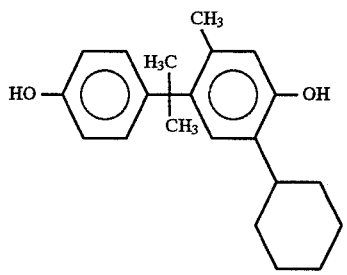
[III-3]

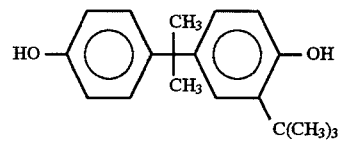
[III-4]

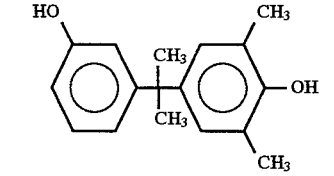
[IV-1]

[IV-2]

As to $R_{31}$ to $R_{41}$ and $R_{42}$ to $R_{52}$ of formulas [V] and [VI], preferred examples of the halogen atom include a chlorine atom, a bromine atom and an iodine atom. Preferred examples of the alkyl group include lower alkyl groups having 1 to 4 carbon atoms such as a methyl group, an ethyl group, a propyl group, an isopropyl group, a n-butyl group, an isobutyl group, a sec-butyl group and a tert-butyl group, and among these, a methyl group is more preferred. Preferred examples of the alkoxyl group include those having 1 to 4 carbon atoms such as a methoxy group, an ethoxy group, a propoxy group, an isopropoxy group, n-butoxy group, an isobutoxy group, a sec-butoxy group, and a tert-butoxy group, and among these, a methoxy group is more preferred. Preferred examples of the cycloalkyl group include a cyclopentyl group and a cyclohexyl group, and a cyclohexyl group is more preferred.

Examples of the compounds represented by formulae [V] and [VI] include compounds represented by the following formulas [V-1] to [V-9] and [VI-1] to [VI-9]. However, the compounds usable in the present invention are not limited to these examples. These polyhydroxy compounds can be used singly or as a mixture of two or more kinds thereof.

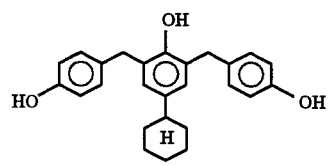

[V-1]

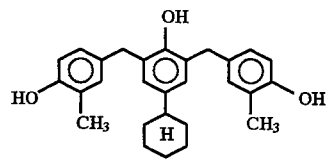

[V-2]

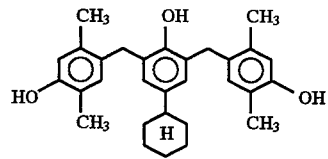

[V-3]

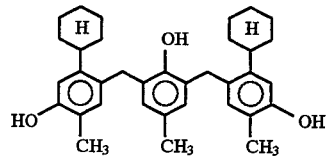

[V-4]

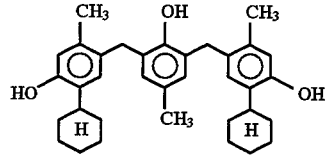

[V-5]

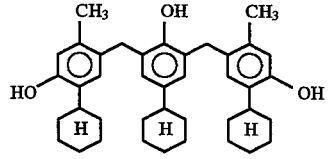

[V-6]

-continued

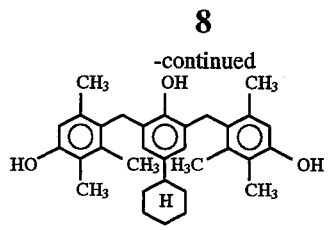

[V-7]

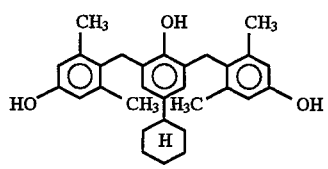

[V-8]

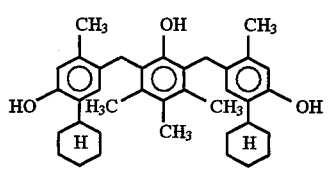

[V-9]

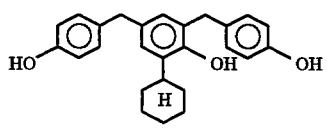

[VI-1]

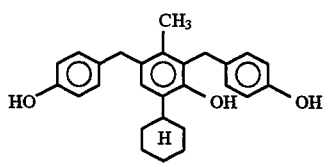

[VI-2]

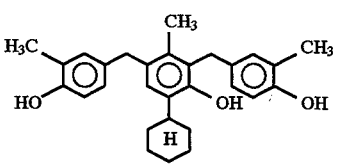

[VI-3]

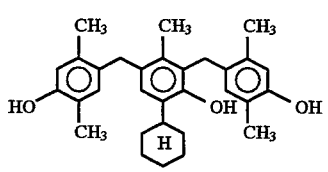

[VI-4]

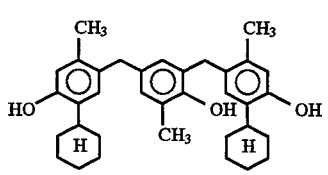

[VI-5]

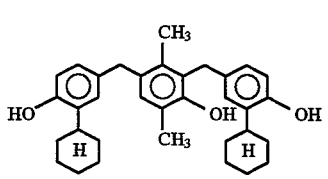

[VI-6]

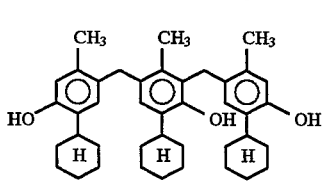

[VI-7]

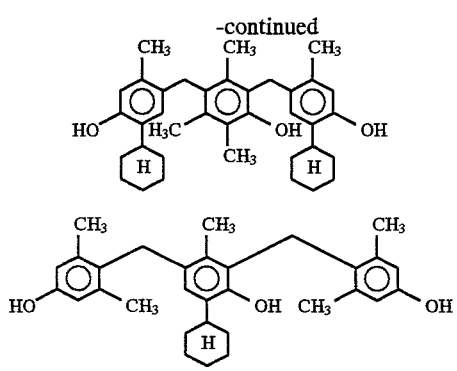

Among these, compounds which ensure the most satisfactory result to achieve the above-mentioned objects of the present invention are those represented by formulae [V] and [VI] wherein at least one of $R_{35}$ to $R_{37}$ or $R_{46}$ to $R_{48}$ is a cyclohexyl group, i.e., compounds represented by formulae [V-1], [V-2], [V-3], [V-7], [V-8], [VI-1], [VI-2], [VI-3], [VI-4], and [VI-9].

Preferred examples of the alkyl group for $R_{61}$ to $R_{71}$ of formulas [VII] include those having 1 to 4 carbon atoms such as a methyl group, an ethyl group, a propyl group, an isopropyl group, a n-butyl group, an isobutyl group, a sec-butyl group, and tert-butyl group, and a methyl group is more preferred. As to $R_{61}$ to $R_{71}$, preferred examples of the halogen atom include a chlorine atom, a bromine atom and an iodine atom; preferred examples of the aryl group include a phenyl group, a tolyl group, a xylyl group, a mesityl group and a cumenyl group; preferred examples of the alkoxyl group include a methoxy group, an ethoxy group, a propoxy group, an isopropoxy group, a n-butoxy group, an isobutoxy group, a sec-butoxy group, and a tert-butoxy group; preferred examples of the acyl group include a formyl group, an acetyl group and a benzoyl group; and preferred examples of the cycloalkyl group include a cyclopentyl group and a cyclohexyl group, and a cyclohexyl group is more preferred.

$R_{61}$ to $R_{64}$ and $R_{68}$ to $R_{71}$ of formula [VII] are preferably a methyl group, an ethyl group, a chlorine atom, a methoxy group, an acetyl group, and a phenyl group. $R_{65}$ to $R_{67}$ are preferably a methyl group, an ethyl group, an isopropyl group, a phenyl group, and a methoxy group.

Examples of the compounds represented by formula [VII] include compounds represented by the following formulas [VII-1] to [VII-12]. However, the compounds usable in the present invention are not limited to these examples. These polyhydroxy compounds can be used singly or as a mixture of two or more kinds thereof.

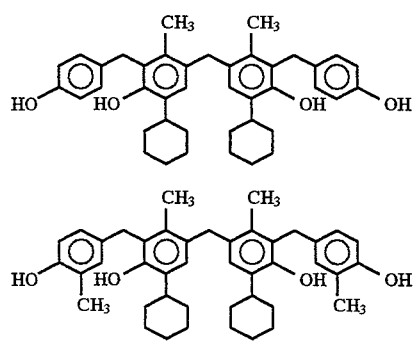

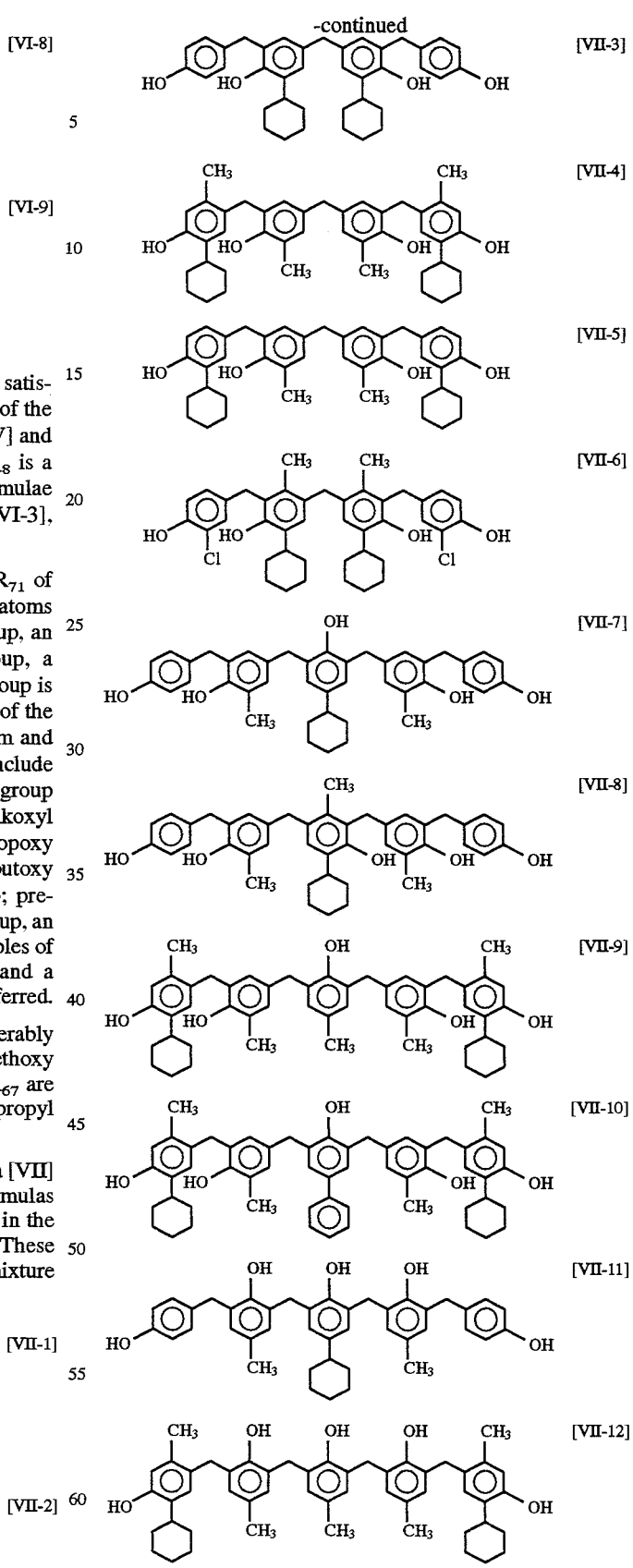

The photosensitive materials to be used in the present invention can be prepared, for example, by an esterification reaction of one of polyhydroxy compounds represented by formulae [I] to [VII] with 1,2-naphthoquinonediazide-5- and/or -4-sulfonyl chlorides in the presence of a basic catalyst.

That is, respective amounts of a polyhydroxy compound and 1,2-naphthoquinonediazide-5- and/or -4-sulfonyl chloride(s) are placed in a flask together with a solvent such as dioxane, acetone, tetrahydrofuran, methyl ethyl ketone, N-methylpyrrolidone, chloroform, trichloroethane, trichloroethylene, dichloroethane, methyl isobutyl ketone, dimethoxyethane, diglyme, ethyl acetate, dichloromethane, and γ-butyrolactone. Subsequently, a basic catalyst such as sodium hydroxide, sodium carbonate, sodium hydrogencarbonate, triethylamine, 4-dimethylaminopyridine, 4-methylmorpholine, N-methylpiperazine, and N-methylpiperidine is added dropwise to the solution to condense the polyhydroxy compound with 1,2-naphthoquinonediazide-5- and/or -4-sulfonyl chloride(s). The resulting product is precipitated in water, washed with water, purified, and then dried.

An ordinary esterification reaction produces a mixture of products different in the number and the position of esterified hydroxy groups. However, the polyhydroxy compounds represented by formulae [I] to [IV] according to the present invention undergo selective esterification due to their specific structure.

In terms of the content of monoesters in the photosensitive materials to be used in the present invention, the esterification can be accomplished selectively by controlling the esterification reaction in the manner that the peak area corresponding to the monoesters occupies 50% or more of the whole peak areas in a high performance liquid chromatogram measured by a detector using a ultraviolet ray of 254 nm. In the present invention, the content of the monoesters is preferably 55% or more, and more preferably 60% or more. To improve the selectivity of the esterification reaction, aliphatic cyclic amines such as 4-methylmorpholine, N-methylpiperazine and N-methylpiperidine are more effective among the above-mentioned basic catalysts.

In the esterification of the polyhydroxy compounds of formulae [V] and [VI], the selective formation of the diesters is easily carried out. The esterification reaction is also preferably controlled in the manner that, in a high performance liquid chromatogram, the peak area of the diesters occupies 50% or more and the peak area of the completely esterified product does not exceed 40%. The peak areas of the diesters not exceeding 50% and the peak area of the completely esterified product of 40% or more cause increase in the film thickness dependence, which impairs the effects of the present invention. It is more preferred that the peak area of the diesters occupies 60% or more and the peak area of the completely esterified product does not exceed 30%, and it is furthermore preferred that the peak area of the diesters occupies 70% or more and the peak area of the completely esterified product does not exceed 20%. Use of an aliphatic cyclic amine such as 4-methylmorpholine, 4-methylpiperazine or N-methylpiperidine is effective to improve the selectivity of the esterification reaction.

An esterification ratio of the polyhydroxy compound represented by formula [VII] can be controlled by a proportion of 1,2-naphthoquinonediazide-5- and/or -4-sulfonyl chloride(s) to the polyhydroxy compound to be used as the starting materials. That is, since 1,2-naphthoquinonediazide-5- and/or -4-sulfonyl chloride(s) almost completely undergo the esterification reaction, the esterification ratio is accordingly determined by the molar ratio of these starting materials to be charged.

In case of the polyhydroxy compound represented by formula [VII], a preferred range of the molar ratio of 1,2-naphtho-quinonediazide-5- and/or -4-sulfonyl chloride (s) to the polyhydroxy compound (1,2-naphthoquinonediazide compound(s)/polyhydroxy compound) is 1.2 to 3.2 when m is 2, and 1.2 to 3.8 when m is 3. A more preferred range of the molar ratio is 1.5 to 2.8 when m is 2, and 1.8 to 3.5 when m is 3. The molar ratio in this range allows a certain amount of a unreacted polyhydroxy compound to remain in a reaction mixture, which causes a good effect on the object of the present invention. The molar ratio not reaching this range causes a marked decrease in film thickness at unexposed areas, whereas that exceeding this range makes it difficult to attain the effect of the present invention.

A 1,2-naphthoquinonediazide-5-sulfonic ester and a 1,2-naphthoquinonediazide-4-sulfonic ester may be used in combination according to need. The reaction temperature of the above-mentioned esterification is usually from −20° to 60° C., and preferably from 0° to 40° C.

The weight ratio of the esters of the polyhydroxy compounds represented by formulae [I] to [IV] to the esters of the polyhydroxy compounds represented by formulae [V] to [VII] to be used as photosensitive materials is preferably from 5/95 to 95/5, and more preferably from 10/90 to 90/10.

To use the photosensitive materials of the present invention as a resin composition, at least 2, or 3 or more kinds of these compounds are mixed and further blended with the alkali-soluble resin. The amount of the photosensitive materials to be mixed is 5 to 100 parts by weight, and preferably 20 to 60 parts by weight, per 100 parts by weight of the alkali-soluble resin. The amount less than 5 parts by weight causes remarkable decrease in the film-remaining ratio, whereas the amount exceeding 100 parts by weight causes reduction in sensitivity and solubility in a solvent.

According to the present invention, the above-mentioned photosensitive materials are used, and if necessary, they may be used in combination with esters prepared from 1,2-naphthoquinonediazide-5- and/or -4-sulfonyl chloride(s) with the following polyhydroxy compounds.

In this case, the proportion of the naphthoquinonediazide esters of the polyhydroxy compound-photosensitive material to the photosensitive material of the present invention is preferably from 20/80 to 80/20 (by weight). If the proportion of the photosensitive materials of the present invention is less than 20% by weight based on the total amount of all photosensitive materials, the effects of the present invention cannot be fully exhibited.

Examples of the above-mentioned polyhydroxy compound include polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone;

polyhydroxyphenyl alkyl ketones such as 2,3,4-trihydroxyacetophenone, 2,3,4-trihydroxyphenyl pentyl ketone, and 2,3,4-trihydroxyphenyl hexyl ketone;

bis((poly)hydroxyphenyl)alkanes such as bis(2,4-dihydroxyphenyl)methane, bis(2,3,4-trihydroxyphenyl) methane, bis(2,4-dihydroxyphenyl)propane-1, bis(2,3,4-trihydroxyphenyl)propane-1, and nordihydroguaiaretic acid;

polyhydroxybenzoic esters such as propyl 3,4,5-trihydroxybenzoate, phenyl 2,3,4-trihydroxybenzoate, and phenyl 3,4,5-trihydroxybenzoate;

bis(polyhydroxybenzoyl)alkanes or bis(polyhydroxybenzoyl)arenes, such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6trihydroxybenzoyl)benzene;

alkylene glycol di(polyhydroxybenzoate)s such as ethylene glycol di(3,5-dihydroxybenzoate) and ethylene glycol di(3,4,5-trihydroxybenzoate);

polyhydroxybiphenyls such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol;

bis(polyhydroxy) sulfides such as 4,4'-thiobis(1,3-dihydroxy)benzene;

bis(polyhydroxyphenyl) ethers such as 2,2',4,4'-tetrahydroxydiphenyl ether;

bis(polyhydroxyphenyl) sulfoxides such as 2,2',4,4'-tetrahydroxydiphenyl sulfoxide;

bis(polyhydroxyphenyl) sulfones such as 2,2',4,4'-tetrahydroxydiphenyl sulfone;

polyhydroxytriphenylmethanes such as tris(4-hydroxyphenyl)methane, 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane, and 2,4,6,2',4',6'-hexahydroxy-5,5'-dipropionyltriphenylmethane;

polyhydroxyspirobiindanes such as 3,3,3',3'-tetramethyl-1,1'-spirobiindane-5,6,5',6'-tetrol, 3,3,3',3'-tetramethyl-1,1'-spirobiindane-5,6,7,5',6',7'-hexol, 3,3,3',3'-tetramethyl-1,1'-spirobiindane-4,5,6,4',5',6'-hexol, and 3,3,3',3'-tetramethyl-1,1'-spirobiindane-4,5,6,5',6',7'-hexol;

polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro[phthalide-3,9'-xanthene];

flavonoid pigments such as morin, quercetin, and rutin;

the polyhydroxy compounds described in JP-A-4-253058, including α,α',α"-tris(4-hydroxyphenyl)-1,3,5-triisopropylbenzene, α,α',α"-tris(3,5-dimethyl-4-hydroxyphenyl)-1,3,5-triisopropylbenzene, α,α',α"-tris(3,5-diethyl-4-hydroxyphenyl)-1,3,5-triisopropylbenzene, α,α',α"-tris(3,5-di-n-propyl-4-hydroxyphenyl)-1,3,5-triisopropylbenzene, α,α',α"-tris(3,5-diisopropyl-4-hydroxyphenyl)-1,3,5-triisopropylbenzene, α,α',α"-tris(3,5-di-n-butyl-4-hydroxyphenyl)-1,3,5-triisopropylbenzene, α,α',α"-tris(3-methyl-4-hydroxyphenyl)-1,3,5-triisopropylbenzene, α,α',α"-tris(3-methoxy-4-hydroxyphenyl)-1,3,5-triisopropylbenzene, α,α',α"-tris(2,4-dihydroxyphenyl)-1,3,5-triisopropylbenzene, 1,3,5-tris(3,5-dimethyl-4-hydroxyphenyl)benzene, 1,3,5tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)ethyl]-benzene, 1-[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α',α'-bis(3"-methyl-4"-hydroxyphenyl)ethyl]benzene, 1-[α-methyl-α-(3'-methoxy-4'-hydroxyphenyl)ethyl]-4-[α',α'-bis(3"-methoxy-4"-hydroxyphenyl)ethyl]benzene, 1-[α-methyl-α-(2',4'-dihydroxyphenyl)ethyl]-4-[α',α'-bis(4"-hydroxyphenyl)ethyl]benzene, and 1-[α-methyl-α-(2',4'-dihydroxyphenyl)ethyl]-3-[α",α'-bis(4"-hydroxyphenyl)ethyl]benzene; and another polyhydroxy compounds such as p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α'-tris(2,3,4-trihydroxybenzoyl)mesitylene, 2,6-bis(2'-hydroxy-3',5'-dimethylbenzyl)-p-cresol, 2,6-bis(2'-hydroxy-5'-methylbenzyl)-p-cresol, 2,6-bis(2'-hydroxy-3',5'-di-t-butylbenzyl)-p-cresol, 2,6-bis(2'-hydroxy-5'-ethylbenzyl)-p-cresol, 2,6-bis(2',4'-dihydroxybenzyl)-p-cresol, 2,6-bis(2'-hydroxy-3'-t-butyl-5'-methylbenzyl)-p-cresol, 2,6-bis(2',3',4'-trihydroxy-5'-acetylbenzyl)-p-cresol, 2,6-bis(2',4',6'-trihydroxybenzyl)-p-cresol, 2,6-bis(2',3',4'-trihydroxybenzyl)-p-cresol, 2,6-bis(2',3',4'-trihydroxybenzyl)-3,5-dimethylphenol, 4,6-bis(4'-hydroxy-3',5'-dimethylbenzyl)pyrogallol, 4,6-bis(4'-hydroxy-3',5'-dimethoxybenzyl)pyrogallol, 2,6-bis(4'-hydroxy-3',5'-dimethylbenzyl)-1,3,4-trihydroxyphenol, 4,6-bis(2',4',6'-trihydroxybenzyl)-2,4-dimethylphenol, and 4,6-bis(2',3',4'-trihydroxybenzyl)-2,5-dimethylphenol.

Also a low molecular weight phenolic resins such as a novolak resin may also be used.

Examples of the alkali-soluble resin for use in the present invention include novolak resins, acetone-pyrogallol resins, and poly(hydroxystyrene) and derivatives thereof.

Of these, novolak resins are especially preferred, which are obtained by the addition condensation of a prescribed monomer as a major ingredient with an aldehyde in the presence of an acid catalyst.

Examples of the prescribed monomer include phenol, cresols such as m-cresol, p-cresol and o-cresol, xylenols such as 2,5-xylenol, 3,5-xylenol, 3,4-xylenol and 2,3-xylenol, alkylphenols such as m-ethylphenol, p-ethylphenol, o-ethylphenol and p-t-butylphenol, trialkylphenols such as 2,3,5-trimethylphenol and 2,3,4-trimethylphenol, alkoxyphenols such as p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, dialkylphenols such as 2-methyl-4-isopropylphenol, and hydroxyl aromatic compounds such as m-chlorophenol, p-chlorophenol, o-chlorophenol, dihydroxybiphenyl, bisphenol A, phenylphenol, resorcinol, and naphthol. These compounds may be used alone or as a mixture of two or more thereof. However, the monomer to be condensed with an aldehyde is not limited thereto.

Examples of the aldehyde include formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals of these aldehydes, e.g., chloroacetaldehyde diethyl acetal. Of these aldehydes, formaldehyde is preferably used.

These aldehydes may be used alone or in combination of two or more thereof.

Examples of the acid catalyst include hydrochloric acid, sulfuric acid, formic acid, acetic acid, and oxalic acid.

As the technique for synthesizing a novolak resin, one in which low-molecular components are removed or diminished is preferred. This technique is disclosed in, e.g., JP-A-60-45238, JP-A-60-97347, JP-A-60-140235, JP-A-60-189739, JP-A-64-14229, JP-A-1-276131, JP-A-2-60915, JP-A-2-275955, JP-A-2-282745, JP-A-4-101147, and JP-A-4-122938, and others.

The novolak resin thus obtained preferably has a weight-average molecular weight of from 1,500 to 25,000. If the molecular weight thereof is lower than 1,500, unexposed parts undergo a considerable decrease in the film thickness after development. If the molecular weight thereof exceeds 25,000, a reduced developing rate results. The weight-average molecular weight as used herein means the value measured by gel permeation chromatography in terms of polystyrene.

It is also preferred that the novolack resin has a degree of dispersion (ratio of the weight-average molecular weight Mw to the number-average molecular weight Mn, i.e., Mw/Mn) of from 1.5 to 7.0, more preferably from 1.5 to 5.0. If the degree of dispersion exceeds 7.0, it is difficult to attain the effects of the present invention. On the other hand, if the degree of dispersion is lower than 1.5, it is unsuitable for practical use because the synthesis of resins of such degree of dispersion necessitates additional steps for a high degree of purification.

The weight average molecular weight and the degree of dispersion can be appropriately adjusted, depending upon the kinds of the novolak resins.

When the alkali-soluble resin is the novolak resin prepared by the condensation reaction of phenol, cresol, xylenol, trimethylphenol, or a mixture of two or more kinds thereof with an aldehyde compound, the weight average molecular weight is preferably from 5,500 to 25,000, and more preferably from 6,000 to 25,000. About these novolak resins, the ratio of the weight average molecular weight to the number average molecular weight is preferably from 1.5 to 5.0.

When the alkali-soluble resins is at least one kind of novolak resins prepared by the condensation reaction of a mixture containing p-cresol, o-cresol, 2,3-xylenol, 2,6-xylenol, and trimethylphenol with an aldehyde compound, it is preferred that the ratio of the weight average molecular weight to the number average molecular weight is from 1.5 to 5.0 and the weight average molecular weight is from 1,500 to 6,000.

As described above, when the weight average molecular weight and the degree of dispersion are adjusted in the respective certain ranges, depending upon the kind of the novolak resins used, the effect of the present invention is markedly promoted.

A water-insoluble and alkali-soluble low-molecular weight compound may preferably be further incorporated into the composition of the present invention in order to accelerate dissolution into a developer. The development latitude can be improved thereby.

Examples of the water-insoluble and alkali-soluble low-molecular weight compound include polyhydroxy compounds. Preferred examples of the polyhydroxy compound include phenols, resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensation resins, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, and para[α,α,α', α'-tetrakis(4-hydroxyphenyl)]xylene.

Among these water-insoluble and alkali-soluble low-molecular weight compounds, those having the total carbon number of 60 or less and containing 2 to 8 phenolic hydroxyl groups in the molecule are preferred.

Further, the water-insoluble and alkali-soluble low-molecular weight compound is preferably at least one of water-insoluble and alkali-soluble low-molecular weight compounds in which the ratio of the number of phenolic hydroxyl groups to the number of aromatic rings is 0.5 to 1.4; the total number of carbon atoms in the molecule is 12 to 50; and the number of phenolic hydroxyl groups in molecule is 2 to 10. Among such compounds, particularly preferred compounds are those which, when they are added to the alkali-soluble resin, can increase the dissolution speed of a water-insoluble and alkali-soluble resin to an alkaline solution. Use of those compounds improves the development latitude.

Use of the compounds having 60 or more carbon atoms causes reduction in the effect of the present invention, whereas use of those having 12 or less carbon atoms brings about another drawbacks such as deterioration in thermal resistance. In order to exert the effects of the present invention, it is necessary for the compounds to contain at least 2 hydroxyl groups in the molecule. On the other hand, hydroxyl groups exceeding 10 result in losing the effect of the present invention on the development latitude. Further, when the ratio of the number of phenolic hydroxyl groups to the number of aromatic rings is less than 0.5, the composition tends to increase the film thickness dependence and to narrow the development latitude. The ratio exceeding 1.4 causes deterioration in the stability of the composition and makes it difficult to obtain high resolution and good film thickness dependence.

The addition amount of these low-molecular weight compounds is preferably from 1 to 80% by weight, and more preferably from 2 to 70% by weight, based on the alkali-soluble resin. The content exceeding 80% by weight results in deterioration in development residue and causes another drawback that a pattern is transformed during development.

The water-insoluble and alkali-soluble low-molecular weight compounds containing aromatic hydroxyl groups can be easily prepared according to methods described in JP-A-4-122938, JP-A-2-28531, U.S. Pat. No. 4,916,210, European Patent 219294, and so forth.

Examples of solvents used for dissolving the photosensitive material and alkali-soluble novolak resins according to the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, and butyl acetate. These organic solvents may be used alone or in combination of two or more thereof.

These organic solvents may also be used as a mixture with a high-boiling solvent such as N-methylformamide, N,N-dimethylformamide, N-methylacetamide, N,N-dimethylacetamide, N-methylpyrrolidone, dimethyl sulfoxide, or benzyl ethyl ether.

A surfactant may be incorporated into the positive photoresist composition of the present invention for the purpose of further improvement in applicability including the prevention of striation.

Examples of the surfactant include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine surfactants such as F-Top EF301, EF303, and EF352 (manufactured by Shin Akita Chemical Co., Ltd., Japan), Megafac F171 and F173 (manufactured by Dainippon Ink & Chemicals, Inc., Japan), Fluorad FC430 and FC431 (manufactured by Sumitomo 3M Ltd., Japan), and Asahi Guard AG710, Surflon S-382, SC101, SC102, SC103, SC104, SC105, and SC106 (manufactured by Asahi Glass Co., Ltd., Japan); and organopolysiloxane polymer KP341 (manufactured by Shin-Etsu Chemical Co., Ltd., Japan) and acrylic and methacrylic acid (co)polymers Polyflow No. 75 and No. 95 (manufactured by Kyoeisha Chemical Co., Ltd., Japan). The addition amount of these surfactants is usually 2 parts by weight or less, preferably 1 part by weight or less, per 100 parts by weight of the sum of the alkali-soluble resin and the quinonediazide compound in the composition of the present invention.

These surfactants may be added either alone or in combination of two or more thereof.

For developing the positive photoresist composition of the present invention, an aqueous solution of an alkali may be used as the developer. Examples of the alkali include inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide and choline, and cyclic amines such as pyrrole and piperidine. An alcohol, e.g., isopropyl alcohol, or a nonionic or another surfactant may be added to the aqueous solution of the alkali in an appropriate amount.

A light absorber, a crosslinking agent, an adhesion aid, and other additives may be incorporated into the positive photoresist composition of the present invention if desired or necessary. The light absorber is added, if desired, for the purpose of preventing halation from a substrate or enhancing the recognizability of the composition applied to a transparent substrate. Examples of the light absorber include the commercial light absorbers disclosed in "Kogyo-yo Shikiso No Gijutsu To Shijo (Technology and Market for Industrial Pigments)" (CMC Shuppan) and "Senryo Binran (Dyes Handbook)" (edited by Organic Synthesis Chemistry Society). Preferred examples thereof include C.I. Disperse Yellow 1, 3, 4, 5, 7, 8, 13, 23, 31, 49, 50, 51, 54, 56, 60, 64, 66, 68, 79, 82, 88, 90, 93, 102, 114, and 124, C.I. Disperse Orange 1, 5, 13, 25, 29, 30, 31, 44, 57, 72, and 73, C.I. Disperse Red 1, 5, 7, 13, 17, 19, 43, 50, 54, 58, 65, 72, 73, 88, 117, 137, 143, 199, and 210, C.I. Disperse Violet 43, C.I. Disperse Blue 96, C.I. Fluorescent Brightening Agent 112, 135, and 163, C.I. Solvent Yellow 14, 16, 33, and 56, C.I. Solvent Orange 2 and 45, C.I. Solvent Red 1, 3, 8, 23, 24, 25, 27, and 49, C.I. Pigment Green 10, and C.I. Pigment Brown 2. The light absorber may be added in an amount of usually 100 parts by weight or less, preferably 50 parts by weight or less, more preferably 30 parts by weight or less, per 100 parts by weight of the alkali-soluble resin.

The crosslinking agent is added in such an amount as not to adversely influence the formation of a positive image. It is added mainly for the purposes of sensitivity regulation and improvement in heat resistance, dry etching resistance and the like.

Examples of the crosslinking agent include compounds obtained by reacting formaldehyde with melamine, benzoguanamine, glycoluril and the like, alkyl-modification products thereof, epoxy compounds, aldehydes, azide compounds, organic peroxides, hexamethylenetetramine and the like. These crosslinking agents may be added in an amount less than 10 parts by weight, preferably less than 5 parts by weight, per 100 parts by weight of the photosensitive material. If the addition amount of the crosslinking agent exceeds 10 parts by weight, the photoresist composition comes to cause reduction in the sensitivity and generate a scum (resist residue).

The adhesion aid is added mainly for the purpose of improving the adherence between the resist to a substrate so as to prevent resist peeling especially during etching. Examples of the adhesion aid include chlorosilanes such as trimethylchlorosilane, dimethylvinylchlorosilane, methyldiphenylchlorosilane and chloromethyldimethylchlorosilane, alkoxysilanes such as trimethylmethoxysilane, dimethyldiethoxysilane, methyldimethoxysilane, dimethylvinylethoxysilane, diphenyldimethoxysilane and phenyltriethoxysilane, silazanes such as hexamethyldisilazane, N,N'-bis(trimethylsilyl)urea, dimethyltrimethylsilylamine and trimethylsilylimidazole, silanes such as vinyltrichlorosilane, γ-chloropropyltrimethoxysilane, γ-aminopropyltriethoxysilane and γ-glycidoxypropyltrimethoxysilane, heterocyclic compounds such as benzotriazole, benzoimidazole, indazole, imidazole, 2-mercaptobenzimidazole, 2-mercaptobenzthiazole, 2-mercaptobenzoxazole, urazol, thiouracil, mercaptoimidazole and mercaptopyrimidine, and urea or thiourea compounds such as 1,1-dimethylurea and 1,3-dimethylurea.

The adhesion aid may be added in an amount usually less than 10 parts by weight, preferably less than 5 parts by weight, per 100 parts by weight of the alkali-soluble resin.

The positive photoresist composition described above is applied to a substrate for use in the production of a precise integrated-circuit element (e.g., a transparent glass or ITO substrate coated with silicon/silicon dioxide) by a suitable coating means, e.g., spin coating, roll coating, flow coating, dip coating, spray coating, and doctor coating. The coating is pre-baked, exposed to light through a desired mask, subjected, if necessary, to post-exposure baking (PEB), and then developed, rinsed and dried. Thus, a satisfactory resist can be obtained.

Examples of the present invention are described below. However, the present invention is not limited by these examples. All % means % by weight, unless otherwise indicated.

SYNTHESIS EXAMPLE 1

(Preparation of Compound [II-2])

In a four-necked flask equipped with a stirrer, a reflux condenser, a thermometer, and a dropping funnel, 76.1 g of a monomethylol derivative of 2,4-xylenol prepared according to an ordinary method, 470 g of phenol and 200 ml of methanol were charged, and 5 ml of concentrated sulfuric acid is slowly added dropwise thereto. The resulting mixture was refluxed with stirring for 6 hours, and then poured into 2 liters of distilled water. Brown precipitates thus formed were purified by silica gel column chromatography to obtain 79.9 g of the desired product [II-2] as white powder.

SYNTHESIS EXAMPLE 2

(Preparation of Compound [III-1])

In a four-necked flask equipped with a stirrer, a reflux condenser, a thermometer, and a dropping funnel, 76.1 g of a monomethylol derivative of 2,6-xylenol prepared according to an ordinary method, 61.1 g of 2,5-xylenol and 200 ml of methanol were charged, and 5 ml of concentrated sulfuric acid was slowly added dropwise thereto. The resulting mixture was reflux with stirring for 6 hours, and then poured into 2 liters of distilled water. Yellow precipitates thus formed were recrystallized from toluene to obtain 96.1 g of the desired product [III-1] as white powder.

SYNTHESIS EXAMPLE 3

(Preparation of Compound [IV-1])

In a four-necked flask equipped with a stirrer, a reflux condenser, a thermometer, and a dropping funnel, 366.5 g of 2,6-xylenol, 200 ml of methanol and 10 ml of concentrated hydrochloric acid were charged, and while keeping the temperature of the resulting mixture at 50° C., 67.1 g of m-isopropenylphenol, which was prepared according to an ordinary method using m-hydroxyacetophenone as a starting material and dissolved in 500 ml of toluene, was added dropwise thereto over a 3-hour period, followed by stirring under heating for 1 hour. After the completion of the reaction, the reaction mixture was neutralized and methanol and toluene were removed therefrom by distillation. A solid thus prepared was washed with a mixture of hexane and toluene, purified by silica gel column chromatography to obtain 60.6 g of the desired product [IV-1] as white powder.

SYNTHESIS EXAMPLE 4

(Preparation of Photosensitive Material a-1)

In a three-necked flask, 22.8 g of compound [II-2], 26.9 g of 1,2-naphthoquinonediazide-5-sulfonyl chloride and 400 ml of acetone were charged and uniformly dissolved, and subsequently, 10.4 g of N-methylpiperidine was slowly added dropwise to the resulting solution to proceed the reaction at 25° C. for 3 hours. The reaction mixture was concentrated, dissolved again in acetone, and then poured into 1.5 liters of a 1% aqueous solution of hydrochloric acid. Precipitate thus formed were filtered, washed with water, and then dried at 40° C. Thus, 41.4 g of 1,2-naphthoquinonediazide-5-sulfonic ester of compound [II-2] (photosensitive material a-1) was obtained.

In high performance liquid chromatography where a ultraviolet ray of 254 nm was used for a detector, the peak area occupied by the monoesters in photosensitive material a-1 was 81% of the whole peak area.

SYNTHESIS EXAMPLE 5

(Preparation of Photosensitive Material a-2)

In a three-necked flask, 25.6 g of compound [III-1], 26.9 g of 1,2-naphthoquinonediazide-5-sulfonyl chloride and 400 ml of acetone were charged and uniformly dissolved, and subsequently, 10.4 g of N-methylpiperidine was slowly added dropwise to the resulting solution to proceed the reaction at 25° C. for 3 hours. The reaction mixture was concentrated, dissolved again in acetone, and then poured into 1.5 liters of a 1% aqueous solution of hydrochloric acid. Precipitates thus formed were filtered, washed with water, and then dried at 40° C. Thus, 44.0 g of 1,2-naphthoquinonediazide-5-sulfonic ester of compound [III-1] (photosensitive material a-2) was obtained.

In high performance liquid chromatography where a ultraviolet ray of 254 nm was used for a detector, the peak area occupied by the monoesters in photosensitive material a-2 was 61% of the whole peak area.

SYNTHESIS EXAMPLE 6

(Preparation of Photosensitive Material a-3)

In a three-necked flask, 24.2 g of compound [IV-1], 26.9 g of 1,2-naphthoquinonediazide-5-sulfonyl chloride and 400 ml of acetone were charged and uniformly dissolved, and subsequently, 10.4 g of N-methylpiperidine was slowly added dropwise to the resulting solution to proceed the reaction at 25° C. for 3 hours. The reaction mixture was concentrated, dissolved again in acetone, and then poured into 1.5 liters of a 1% aqueous solution of hydrochloric acid. Precipitates thus formed were filtered, washed with water, and then dried at 40° C. Thus, 42.7 g of 1,2-naphthoquinonediazide-5-sulfonic ester of compound [IV-1] (photosensitive material a-3) was obtained.

In high performance liquid chromatography where a ultraviolet ray of 254 nm was used for a detector, the peak area occupied by the monoesters in photosensitive material a-3 was 63% of the whole peak area.

SYNTHESIS EXAMPLE 7

(Preparation of Compound IV-1])

In a four-necked flask equipped with a stirrer, a reflux condenser, a thermometer, and a dropping funnel, 176.3 g of 4-cyclohexylphenol, 455.8 g of a 25% aqueous solution of tetramethylammonium hydroxide and 500 ml of distilled water were charged and heated at 50° C. with stirring to dissolve the 4-cyclohexylphenol. To the solution, 483.4 g of a 37% formalin was added dropwise, and the resulting mixture was heated with stirring for 8 hours To the resulting reaction mixture, 75 g of acetic acid was added dropwise, and precipitates thus formed were filtered to obtain 160 g of compound a as white powder.

In a reaction vessel similar to that described above, 118 g of compound a prepared above, 706 g of phenol and 1 liter of methanol were charged to dissolve compound a, and 5 g of sulfuric acid was added dropwise thereto over a 10-minute period. The resulting mixture was refluxed with stirring for 5 hours, and then poured into 10 liters of distilled water. White solids thus formed were filtered, and added to 2 liters of toluene. The resulting mixture was stirred for 30 min, and insoluble matters were filtered to obtain 80 g of the desired product (compound [V-1]). Purity of the desired product was found to be 99% by gel-permeation chromatography using polystyrene as a standard.

SYNTHESIS EXAMPLE 8

(Preparation of Compound [V-2])

Compound [V-2] was prepared in a similar manner as in Synthesis Example 7 except that 540 g of o-cresol was used in place of the phenol in Synthesis Example 7. Purity of the desired product was found to be 99%.

SYNTHESIS EXAMPLE 9

(Preparation of Compound [VI-1])

Compound [VI-1] was prepared in a similar manner as in Synthesis Example 7 except that 2-cyclohexylphenol was used in place of the 4-cyclohexylphenol in Synthesis Example 7. Purity of the desired product was found to be 99%.

SYNTHESIS EXAMPLE 10

(Preparation of Photosensitive Material b-1)

In a three-necked flask, 38.9 g of compound [V-1], 53.7 g of 1,2-naphthoquinonediazide-5-sulfonyl chloride and 800 ml of acetone were charged and uniformly dissolved, and subsequently, 20.8 g of N-methylpiperidine was slowly added dropwise to the resulting solution to proceed the reaction at 25° C. for 3 hours. The reaction mixture was poured into 3 liters of a 1% aqueous solution of hydrochloric acid, and a precipitate thus formed was filtered, washed with water, and then dried at 40° C. to obtain 76.8 g of 1,2-naphthoquinonediazide-5-sulfonic ester of compound [V-1] (photosensitive material b-1).

In high performance liquid chromatography where a ultraviolet ray of 254 nm was used for a detector, the peak area occupied by the diesters contained in photosensitive material b-1 was 82% of the whole peak area and the peak area occupied by the completely esterified product (triester derivative) was 10% of the whole peak area.

The measurement by the high performance liquid chromatography was conducted by means of LC-6A chromatograph manufactured by Shimadzu Corp. under the following conditions.

Column: Nova-Pak C18 (4 μm) manufactured by Waters Co., Ltd., 8 mm$\phi$×100 mm

Carrier: water 68.6%, acetonitrile 30.0%, triethylamine 0.7%, phosphoric acid 0.7%

Flow Rate: 2.0 ml/min

SYNTHESIS EXAMPLE 11

(Preparation of Photosensitive Material b-2)

In a three-necked flask, 41.7 g of compound [V-2], 53.7 g of 1,2-naphthoquinonediazide-5-sulfonyl chloride and 800 ml of acetone were charged and uniformly dissolved, and subsequently, 20.8 g of N-methylpiperidine was slowly added dropwise to the resulting solution to proceed the reaction at 25° C. for 3 hours. The reaction mixture was poured into 3 liters of a 1% aqueous solution of hydrochloric acid, a precipitates thus formed were filtered, washed with water, and then dried at 40° C. to obtain 79.4 g of 1,2-naphthoquinonediazide-5-sulfonic ester of compound [V-2] (photosensitive material b-2).

In high performance liquid chromatography where a ultraviolet ray of 254 nm was used for a detector, the peak area occupied by the diesters contained in photosensitive material b-2 was 78% of the whole peak area, and the peak area occupied by the completely esterified product (triester derivative) was 12% of the whole peak area.

SYNTHESIS EXAMPLE 12

(Preparation of Photosensitive Material b-3)

In a three-necked flask, 38.9 g of compound [VI-1], 53.7 g of 1,2-naphthoquinonediazide-5-sulfonyl chloride and 800 ml of acetone were placed and uniformly dissolved, and subsequently, 20.8 g of N-methylpiperidine was slowly added dropwise to the resulting solution to proceed the reaction at 25° C. for 3 hours. The resulting reaction mixture was poured into 3 liters of a 1% aqueous solution of hydrochloric acid, and precipitate thus formed were filtered, washed with water, and then dried at 40° C. to obtain 76.8 g of 1,2-naphthoquinonediazide-5-sulfonic ester of compound [VI-1] (photosensitive material b-3).

In high performance liquid chromatography where a ultraviolet ray of 254 nm was used for the detector, the peak area occupied by the diesters contained in photosensitive material b-3 was 87% of the whole peak areas, and the peak area occupied by the completely esterified product (triester derivative) was 6% of the whole peak area.

SYNTHESIS EXAMPLE 13

(Preparation of Compound [VII-5])

In a four-necked flask equipped with a stirrer, a reflux condenser, a thermometer, and a dropping funnel, 228.3 g of bis(3-methyl-4-hydroxyphenyl)methane, 134.7 g of potassium hydroxide, 3 liters of distilled water, and 1 liter of methanol were charged and stirred to dissolve the bis(3-methyl-4-hydroxyphenyl)methane. To the resulting aqueous solution, a 37% formalin was added dropwise over an 1-hour period and the mixture was then stirred for 48 hours. The resulting reaction mixture was neutralized with acetic acid, and precipitates thus formed were collected to obtain 256.8 g of pale yellow solids (compound B).

Compound B:

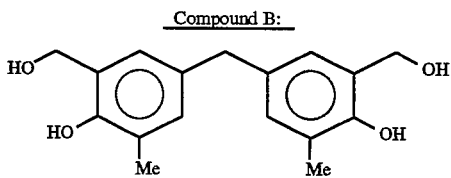

In a reaction vessel similar to that described above, 144.2 g of compound B thus obtained, 880 g of 2-cyclohexylphenol and 1 liter of methanol were charged and heated to 40° C. with stirring to thoroughly dissolve compound B and 2-cyclohexylphenol, and 5 g of concentrated sulfuric acid was then added dropwise thereto over a 10-minunte period. The mixture was reflux with stirring for 8 hours, and then poured into 10 liters of distilled water. Brown solids thus formed were purified by column chromatography to obtain 180.0 g of compound [VII-5].

SYNTHESIS EXAMPLE 14

(Preparation of Compound [VII-7])

In a four-necked flask equipped with a stirrer, a reflux condenser, a thermometer, and a dropping funnel, 176.3 g of 4-cyclohexylphenol, 455.8 g of a 25% aqueous solution of tetramethylammonium hydroxide and 500 ml of distilled water were charged and heated to 50° C. with stirring to dissolve the 4-cyclohexylphenol. To the solution, 483.4 g of a 37% formalin was added dropwise, and then heated with stirring for 8 hours. The resulting reaction mixture was neutralized with hydrochloric acid, and white powders thus precipitated were filtered to obtain 160 g of compound C.

Compound C:

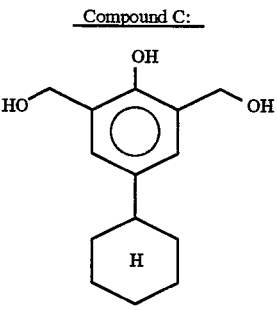

In a reaction vessel similar to that described above, 70.9 g of compound C, 324.4 g of o-cresol and 600 ml of methanol were charged, and after the compound C was dissolved, 3.0 g of concentrated sulfuric acid was added dropwise thereto over a 10-minunte period. The mixture was refluxed with stirring for 5 hours, and then poured into 6 liters of distilled water. White solids thus obtained were filtered, and purified by column chromatography to obtain 68.7 g of compound D.

Compound D:

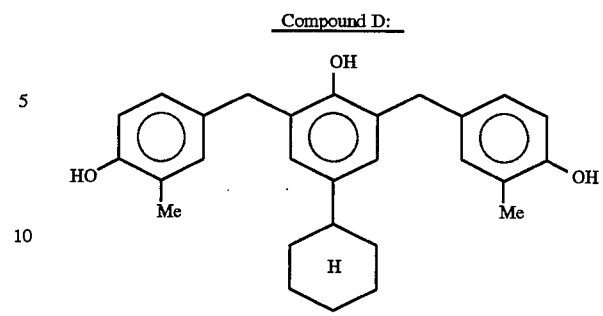

In a reaction vessel similar to that described above, 41.7 g of compound D thus obtained and 137.3 g of a 25% aqueous solution of tetramethylammonium hydroxide were charged, and heated at 40° C. with stirring to dissolve compound D. Subsequently, 48.7 g of a 37% formalin was added dropwise to the solution, and then the mixture was heated with stirring for 8 hours. The resulting reaction mixture was neutralized with hydrochloric acid, and white powders thus precipitated were filtered to obtain 42.9 g of compound E.

Compound E:

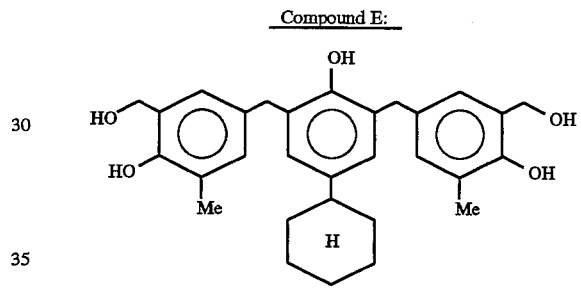

In a reaction vessel similar to that described above, 42.9 g of compound E thus obtained, 84.7 g of phenol and 150 ml of methanol were charged, and after the compound E was dissolved, 1.0 g of concentrated sulfuric acid was added dropwise thereto over a 10-minunte period. This mixture was reflux with stirring for 5 hours, and then poured into 1.5 liters of distilled water. White solids thus precipitated was filtered, and purified by column chromatography to obtain 37.7 g of compound [VII-7] as white solids.

SYNTHESIS EXAMPLE 15

(Preparation of Photosensitive Material c-1)

In a three-necked flask, 60.1 g of compound [VII-5], 53.7 g of 1,2-naphthoquinonediazide-5-sulfonyl chloride and 800 ml of acetone were charged and uniformly dissolved, and subsequently, 20.8 g of N-methylpiperidine was slowly added dropwise thereto to proceed the reaction at 25° C. for 3 hours. The resulting reaction mixture was poured into 2.5 liters of a 1% aqueous solution of hydrochloric acid, and precipitates thus formed were filtered, washed with water, and then dried. Thus, 97.0 g of 1,2-naphthoquinonediazide-5-sulfonic ester of compound [VII-5] (photosensitive material c-1) was obtained.

SYNTHESIS EXAMPLE 16

(Preparation of Photosensitive Material c-2)

In a three-necked flask, 62.9 g of compound [VII-7], 67.2 g of 1,2-naphthoquinonediazide-5-sulfonyl chloride and 900 ml of acetone were charged and uniformly dissolved, and subsequently, 26.0 g of N-methylpiperidine was slowly added dropwise to the solution to proceed the reaction at 25° C. for 3 hours. The resulting reaction mixture was poured into 3 liters of a 1% aqueous solution of hydrochloric acid, and precipitates thus formed were filtered, washed with water, and then dried. Thus, 108.8 g of 1,2-naphthoquinonediazide-5-sulfonic ester of compound [VII-7] (photosensitive material c-2) was obtained.

SYNTHESIS EXAMPLE 17

(Preparation of Novolak Resin A)

In a three-necked flask, 45 g of m-cresol, 55 g of p-cresol, 49 g of a 37% formalin, and 0.13 g of oxalic acid were charged, heated to 100° C. with stirring to proceed the reaction for 15 hours.

The temperature was then raised to 200° C., and the pressure was gradually reduced to 5 mmHg to remove water, unreacted monomer, formaldehyde, oxalic acid, and others. Subsequently, an fused alkali-soluble novolak resin was cooled to room temperature and recovered. Novolak resin A thus prepared had a weight average molecular weight of 8,100 (in terms of polystyrene) and a degree of dispersion of 6.30.

SYNTHESIS EXAMPLE 18

(Preparation of Novolak Resin B)

First, 30 g of p-cresol, 14 g of o-cresol, 50 g of 2,3-dimethylphenol, 20 g of 2,3,5-trimethylphenol, 4.9 g of 2,6-dimethylphenol were mixed with 50 g of diethylene glycol monomethyl ether, and the resulting mixture was then charged in a three-necked flask equipped with a stirrer, a reflux condenser and a thermometer. Subsequently, 85 g of a 37% formalin was added to the mixture, and heated with stirring in an oil bath of 110° C. When the inner temperature reached 90° C., 6.3 g of oxalic acid dihydrate was added to the mixture. The reaction was then carried out in an oil bath kept at 130° C. for 18 hours. Subsequently, the reflux condenser was removed from the flask, and the reaction mixture was distilled at 200° C. under reduced pressure to remove unreacted monomer. Novolak resin B thus prepared was 3,280 in the weight average molecular weight and 2.75 in the degree of dispersion.

SYNTHESIS EXAMPLE 19

(Preparation of Novolak Resin C)

In a three-necked flask, 50 g of m-cresol, 25 g of p-cresol, 28 g of 2,5-xylenol, 53 g of a 37% formalin, and 0.15 g of oxalic acid were charged and heated to 100° C. with stirring, and the mixture was allowed to react at the temperature for 14 hours.

Thereafter, the temperature was raised to 200° C. and the pressure was gradually reduced to 1 mmHg to remove water, unreacted monomer, formaldehyde, oxalic acid, and others. A fused novolak resin thus prepared was cooled to room temperature to recover. The novolak resin had a weight average molecular weight of 4,800 (in terms of polystyrene). Subsequently, 20 g of this novolak resin was completely dissolved in 60 g of methanol, and 30 g of water was gradually added to the solution with stirring to precipitate resin components. The upper layer was removed by decantation, and the resin components precipitated was recovered and dried by heating to 40° C. under reduced pressure for 24 hours to obtain a dried alkali-soluble novolak resin C. The resin had a weight average molecular weight of 9,960 (in terms of polystyrene) and a degree of dispersion of 3.50. The contents of monomer, dimer, and trimer in the resin were 0%, 2.3%, and 3.5%, respectively, and the amount of low-molecular weight components removed by the fractional reprecipitation was found to be 43%.

SYNTHESIS EXAMPLE 20

(Preparation of Novolak Resin D)

In a three-necked flask, 60 g of m-cresol, 20 g of p-cresol, 25 g of 2,3,5-trimethylphenol, 56 g of a 37% formalin, and 0.16 g of oxalic acid were charged, heated to 100° C. with stirring, and allowed to react at the temperature for 16 hours.

Thereafter, the temperature was raised to 200° C. and the pressure was gradually reduced to 1 mmHg to remove water, unreacted monomer, formaldehyde, oxalic acid, and others. A fused novolak resin thus obtained was then cooled to room temperature to recover. The novolak resin thus prepared had a weight average molecular weight of 3,800 (in terms of polystyrene). Subsequently, 20 g of this novolak resin was thoroughly dissolved in 60 g of acetone, and 60 g of hexane was gradually added to the solution. The mixture was allowed to stand for 2 hours, and the upper layer was separated by decantation to recover a precipitated resin, which was then dried at 40° C. for 24 hours under reduced pressure. Alkali-soluble novolak resin D thus obtained had a weight average molecular weight of 8,300 (in terms of polystyrene) and a degree of dispersion of 3.20. The contents of monomer, dimer and trimer in the resin were 0%, 2.1% and 3.0%, respectively, and the amount of low-molecular weight components removed by the fractional reprecipitation was found to be 56%.

Preparation and Evaluation of Positive Photoresist composition:

To prepare photoresist compositions, photosensitive materials a-1 to a-3 prepared in Synthesis Examples 4 to 6, photosensitive materials b-1 to b-3 prepared in Synthesis Examples 10 to 12, photosensitive materials c-1 and c-2 prepared in Synthesis Examples 15 and 16, novolak resins A to D prepared in Synthesis Examples 17 to 20, solvents, and polyhydroxy compounds, if necessary, were mixed in proportions shown in Table 1 to form uniform solutions, each of which has filtered through a microfilter made of Teflon having a pore size of 0.10 µm. The resulting photoresist compositions were applied to silicon wafers by means of a spinner while varing the rotation number and dried at 90° C. for 60 seconds on a vacuum adhesion-type hot plate to give photoresist films having a film thickness of 0.97 or 1.02 µm.

These films were expososed by means of a reduction-projecting exposure apparatus (NSR-2005i9C manufactured by Nikon Corp.), subjected to post exposure bake at 110° C. for 60 sec, developed with a 2.38% aqueous solution of tetramethylammonium hydroxide for 1 min, washed with water for 30 sec, and then dried.

TABLE 1

| | Novolak Resin | | Photosensitive Material | | | Polyhydroxy Compound | | Solvent | |
|---|---|---|---|---|---|---|---|---|---|
| | Kind | Amount | Kind | Ratio | Amount | Kind | Amount | Kind | Amount |
| Example | | | | | | | | | |
| 1 | A | 100 | a-1/b-1 | 3/7 | 27 | — | — | s-1 | 370 |
| 2 | A | 100 | a-2/b-3 | 6/4 | 29 | — | — | s-2 | 360 |
| 3 | A | 100 | a-3/c-1 | 4/6 | 28 | — | — | s-3 | 350 |
| 4 | B | 81 | a-1/b-1 | 3/7 | 27 | p-1 | 20 | s-1 | 360 |
| 5 | B | 82 | a-2/b-2 | 2/8 | 30 | p-3 | 18 | s-2 | 360 |
| 6 | B | 80 | a-3/b-1 | 1/9 | 28 | p-2 | 19 | s-2/s-4 | 285/95 |
| 7 | B | 80 | a-3/c-2 | 4/6 | 30 | p-1 | 20 | s-3 | 350 |
| 8 | C | 80 | a-1/b-1 | 7/3 | 29 | p-1 | 21 | s-1 | 360 |
| 9 | C | 71 | a-2/b-1 | 2/8 | 28 | p-2 | 21 | s-2 | 360 |
| 10 | C | 82 | a-3/b-2 | 2/8 | 31 | p-3 | 20 | s-3 | 370 |
| 11 | D | 80 | a-1/b-1 | 3/7 | 30 | p-2 | 19 | s-2 | 350 |
| 12 | D | 82 | a-2/c-2 | 4/6 | 29 | p-1 | 18 | s-2/s-4 | 285/95 |
| 13 | D | 80 | a-3/b-1 | 2/8 | 30 | p-3 | 20 | s-3 | 370 |
| Comparative Example | | | | | | | | | |
| 1 | A | 100 | a-1 | — | 30 | — | — | s-1 | 360 |
| 2 | A | 100 | a-2 | — | 31 | | | | |
| 3 | B | 81 | a-1 | — | 30 | p-2 | 19 | s-2 | 370 |
| 4 | B | 80 | a-2 | — | 39 | p-1 | 23 | s-1 | 360 |
| 5 | B | 79 | a-3 | — | 33 | p-3 | 18 | s-3 | 350 |
| 6 | C | 79 | a-1 | — | 30 | p-2 | 19 | s-2 | 360 |
| 7 | C | 80 | a-3 | — | 31 | p-3 | 20 | s-3 | 380 | p-1: α,α,α'-tris(4-hydroxphenyl)-1-ethyl-4-isoporpylbenzene
p-2: tris(4-hydroxyphenyl)methane
p-3: 1,1-bis(4-hydroxyphenyl)cyclohexane
s-1: ethyl cellsolve acetate
s-2: ethyl 2-hydroxypropionate
s-3: methyl 3-methoxypropionate
s-4: ethyl 3-ethoxypropionate.

To evaluate the resists, the resist patterns on the silicon wafers thus formed were observed by means of a scanning electron microscope. The results are shown in Table 2.

The sensitivity was defined as the inverse of the exposure amount for reproducing a 0.60-μm mask pattern, and is shown as a relative value based on the sensitivity of the 1.02 μm-thick resist of Comparative Example 1.

The resolving power means the critical resolving power as measured at the exposure amount for reproducing a 0.60-μm mask pattern.

The resist shape is shown in terms of the angle (θ) formed by the flat silicon wafer surface and the resist wall in a section of 0.60-μm resist pattern.

TABLE 2

| | Relative Sensitivity Film Thickness | | Resolution (μm) Film Thickness | | Shape of Resist Film Thickness | |
|---|---|---|---|---|---|---|
| | 0.97 μm | 1.02 μm | 0.97 μm | 1.02 μm | 0.97 μm | 1.02 μm |
| Example | | | | | | |
| 1 | 1.0 | 1.0 | 0.34 | 0.34 | 87 | 87 |
| 2 | 1.2 | 1.1 | 0.32 | 0.32 | 88 | 88 |
| 3 | 1.1 | 1.1 | 0.33 | 0.33 | 87 | 87 |
| 4 | 1.0 | 1.0 | 0.30 | 0.30 | 89 | 89 |
| 5 | 1.1 | 1.1 | 0.30 | 0.30 | 88 | 88 |
| 6 | 1.0 | 1.0 | 0.30 | 0.30 | 89 | 89 |
| 7 | 1.2 | 1.2 | 0.29 | 0.29 | 88 | 88 |
| 8 | 1.1 | 1.1 | 0.31 | 0.31 | 88 | 88 |
| 9 | 1.0 | 1.1 | 0.31 | 0.31 | 87 | 87 |
| 10 | 1.2 | 1.2 | 0.32 | 0.32 | 87 | 87 |
| 11 | 1.0 | 1.0 | 0.31 | 0.31 | 87 | 87 |
| 12 | 1.0 | 1.0 | 0.31 | 0.31 | 88 | 88 |
| 13 | 1.1 | 1.1 | 0.30 | 0.30 | 88 | 88 |

TABLE 2-continued

| | Relative Sensitivity Film Thickness | | Resolution (μm) Film Thickness | | Shape of Resist Film Thickness | |
|---|---|---|---|---|---|---|
| | 0.97 μm | 1.02 μm | 0.97 μm | 1.02 μm | 0.97 μm | 1.02 μm |
| Comparative Example | | | | | | |
| 1 | 0.9 | 1.0 | 0.35 | 0.36 | 83 | 82 |
| 2 | 1.0 | 0.8 | 0.34 | 0.33 | 85 | 84 |
| 3 | 0.9 | 1.0 | 0.31 | 0.33 | 86 | 87 |
| 4 | 1.1 | 1.2 | 0.33 | 0.32 | 87 | 86 |
| 5 | 1.0 | 1.2 | 0.32 | 0.30 | 86 | 88 |
| 6 | 1.0 | 1.1 | 0.35 | 0.33 | 87 | 87 |
| 7 | 0.8 | 1.0 | 0.32 | 0.35 | 89 | 88 |

The results suggest that the resists wherein the photosensitive materials according to the present invention are used show good resolution, good shape, and low film thickness dependence of the resist performances.

Thus, the present invention provides positive photoresist compositions which have high sensitivity, high resolution, and low film thickness dependence of the resist performances.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising, in admixture, an alkali-soluble resin, at least one of 1,2-naphthoquinonediazidesulfonic monoesters of polyhydroxy compounds represented by the following formulae [I] to [IV], and at least one of 1,2-naphthoquinonediazidesulfonic esters of polyhydroxy compounds represented by the following formulae [V] to [VII]:

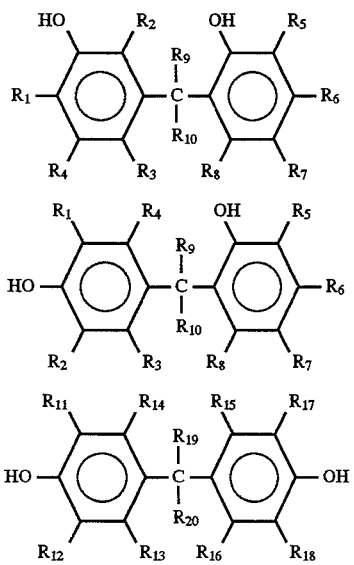

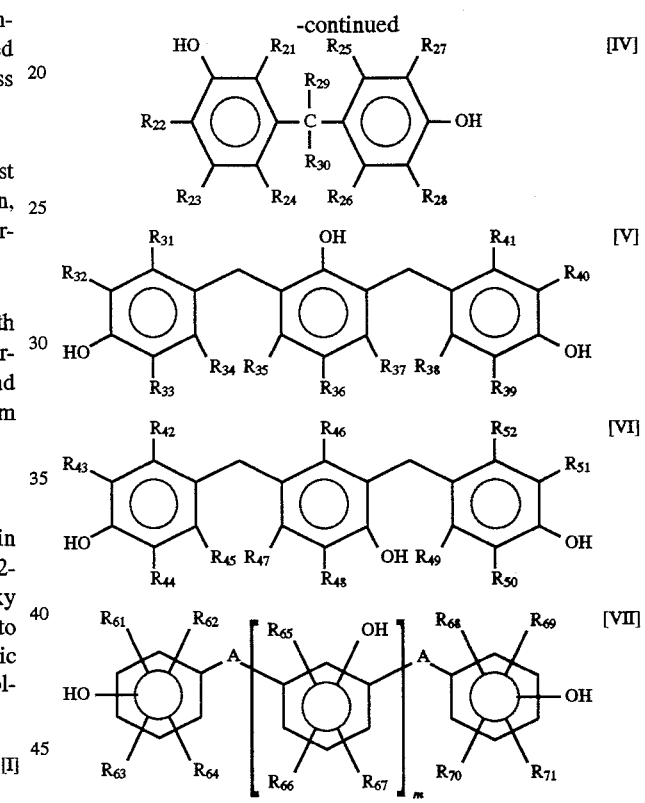

wherein $R_1$ and $R_2$ each independently represent a hydrogen atom, a halogen atom, an alkyl group, or an aryl group, with the proviso that either one of $R_1$ and $R_2$ is a hydrogen atom; $R_3$ and $R_4$ each independently represent a hydrogen atom, a halogen atom, an alkyl group, an aryl group, or a cycloalkyl group; $R_5$ represents a hydrogen atom, an alkyl group, an aryl group, or a cycloalkyl group, with the proviso that $R_5$ can not be a hydrogen atom, when both of $R_9$ and $R_{10}$ are hydrogen atoms; $R_6$ to $R_8$ each independently represent a hydrogen atom, an alkyl group, an aryl group, or a cycloalkyl group; $R_9$ and $R_{10}$ each independently represent a hydrogen atom or an alkyl group, or may combine with each other to form a ring; $R_{11}$, $R_{12}$, $R_{21}$, and $R_{22}$ each independently represent a hydrogen atom, a halogen atom, an alkyl group, or an aryl group, with the proviso that either one of $R_{11}$ and $R_{12}$ and either one of $R_{21}$ and $R_{22}$ are hydrogen atoms; $R_{13}$, $R_{14}$, $R_{23}$, and $R_{24}$ each independently represents a hydrogen atom, a halogen atom, an alkyl group, an aryl group, or a cycloalkyl group; $R_{15}$, $R_{16}$, $R_{25}$, and $R_{26}$ each independently represent a hydrogen atom, an alkyl group, an aryl group, or a cycloalkyl group; $R_{19}$ and $R_{20}$, and $R_{29}$ and $R_{30}$ each independently have the same meaning as that of $R_9$ and $R_{10}$; $R_{17}$, $R_{18}$, $R_{27}$, and $R_{28}$ each independently represent a hydrogen atom, an alkyl group, an aryl group, or a cycloalkyl group, with the proviso that both of $R_{17}$ and $R_{18}$ and both of $R_{27}$ and $R_{28}$ are not hydrogen atoms at the same time; $R_{31}$ to $R_{52}$ each independently represent a hydrogen atom, a halogen atom, an alkyl group, an alkoxyl group, or a cycloalkyl group, with the proviso that at least one of $R_{31}$ to $R_{41}$ and at least one of $R_{42}$ to $R_{52}$ are cycloalkyl groups; $R_{61}$ to $R_{71}$ each independently represent a hydrogen atom, a halogen atom, an alkyl group, an aryl group, an alkoxyl group, an acyl group, or a cycloalkyl group, with the proviso that at least one of $R_{61}$ to $R_{71}$ is a cycloalkyl group; A represents —CH($R_{72}$)—, in which $R_{72}$ represents a hydrogen atom or an alkyl group; and m represents 2 or 3.

2. The positive photoresist composition of claim 1, wherein the weight ratio of said 1,2-naphthoquinonediazidesulfonic monoesters of polyhydroxy compounds represented by formulae [I] to [IV] to said 1,2-naphthoquinonediazidesulfonic esters of polyhydroxy compounds represented by formulae [V] to [VII] is from 5/95 to 95/5.

3. The positive photoresist composition of claim 1, wherein the total amount of said 1,2-naphthoquinonediazidesulfonic monoesters of polyhydroxy compounds represented by formulae [I] to [IV] and said 1,2-naphthoquinonediazidesulfonic esters of polyhydroxy compounds represented by formulae [V] to [VII] is from 5 to 100 parts by weight per 100 parts by weight of said alkali-soluble resin.

* * * * *